US006741804B2

(12) United States Patent
Mack et al.

(10) Patent No.: US 6,741,804 B2
(45) Date of Patent: May 25, 2004

(54) APPARATUS AND METHOD FOR RAPID THERMAL PROCESSING

(75) Inventors: Brian J. Mack, Phoenix, AZ (US); John K. Shriver, Gilbert, AZ (US); Charles L. Vaughan, Tempe, AZ (US)

(73) Assignee: Innovent Systems, Inc., Phoenix, AZ (US)

( * ) Notice: Subject to any disclaimer, the term of this patent is extended or adjusted under 35 U.S.C. 154(b) by 0 days.

(21) Appl. No.: 10/289,469

(22) Filed: Nov. 8, 2002

(65) Prior Publication Data

US 2003/0075536 A1 Apr. 24, 2003

Related U.S. Application Data

(63) Continuation of application No. 09/378,200, filed on Aug. 19, 1999, now Pat. No. 6,496,648.

(51) Int. Cl.[7] .................................................. F26B 19/00

(52) U.S. Cl. ....................... 392/416; 392/418; 219/390; 219/405; 219/411; 438/795; 438/797; 118/724; 118/725; 118/50.1

(58) Field of Search ................................ 438/795, 797; 392/418, 416; 219/390, 405, 411; 118/724, 725, 50.1; 250/492.2

(56) References Cited

U.S. PATENT DOCUMENTS

| | | | | |
|---|---|---|---|---|
| 3,862,397 A | * | 1/1975 | Anderson et al. | 219/405 |
| 4,482,393 A | | 11/1984 | Nishiyama et al. | |
| 4,558,660 A | | 12/1985 | Nishizawa et al. | |
| 4,686,113 A | | 8/1987 | Delfino et al. | |
| 4,859,908 A | * | 8/1989 | Yoshida et al. | 315/111.81 |
| 4,926,793 A | * | 5/1990 | Arima et al. | 118/730 |
| 5,418,885 A | * | 5/1995 | Hauser et al. | 392/416 |
| 5,472,508 A | | 12/1995 | Saxena | |
| 5,530,222 A | * | 6/1996 | Peck et al. | 219/390 |
| 5,702,529 A | * | 12/1997 | Mikata et al. | 118/722 |

OTHER PUBLICATIONS

Peters, Laura, “Thermal Processing's Tool of Choice: Single–Wafer RTP or Fast Ramp Batch”, Semiconductor International, Apr. 1998, pp. 83–90, U.S.A.

Tsakalis, Kostas, “Intergated Indentification and Control for Diffusion/CVD Furnaces”, 6$^{th}$ IEEE Intl. ETFA Conf. 514–519, Los Angeles, CA, U.S.A., Sep. 9–12, 1997.

* cited by examiner

*Primary Examiner*—Shawntina Fuqua
(74) *Attorney, Agent, or Firm*—Kevin B. Jackson

(57) ABSTRACT

An apparatus for rapid thermal processing is described and includes a cylindrical lamp array structure (13) surrounding a cylindrical process tube (16). The cylindrical process tube (16) has a lengthwise central axis (22). The cylindrical lamp array structure (13) includes heat sources or lamps (26). The lamps (26) are positioned with respect to the cylindrical process tube (16) so that the sides of the lamps (26) focus light energy in the direction of the lengthwise central axis (22). Substrates (12) are oriented within the cylindrical process tube (16) so that the major surfaces (14) of the substrates (12) are substantially normal to the lengthwise central axis (22). In an alternative embodiment, a magnetic field source (19) is included for processing storage devices such as non-volatile memory devices.

19 Claims, 4 Drawing Sheets

11

APPARATUS AND METHOD FOR RAPID THERMAL PROCESSING

This application is a continuation of U.S. patent application Ser. No. 09/378,200 filed Aug. 19, 1999 now U.S. Pat. No. 6,496,648.

BACKGROUND OF THE INVENTION

This invention relates, in general, to the processing of electronic devices, and more particularly to structures and methods for rapidly heating substrates.

The need for non-volatile memory (NVM) devices is rapidly growing due to a large demand for consumer products that retain information in the absence of applied power. This is especially true for portable equipment such as pagers, cellular phones, smart cards, portable computers and personal information managers. Flash memory, ferroelectric memory, and magnetic memory devices are experiencing rapid growth, while established NVM technologies such as EPROM, EEPROM and ROM appear to be stable. Such a diversity of NVM devices utilizing unique materials presents manufacturers with new and often difficult manufacturing challenges.

Rapid thermal processors (RTPs) have been used for sometime in the semiconductor industry mainly in contact formation, barrier layer formation, and implant activation. Although RTPs provide an advantage over conventional furnace processing (e.g., faster ramp rates and reduced process times), RTPs have a disadvantage in that they process a single substrate at time. This affects system throughput and the cost of ownership.

Thus, tools and methods are needed for processing new materials and structures, such as those in nonvolatile memory devices, as wells as for processing conventional materials and structures. The tools and methods must flexible, cost effective, simple to use, and capable of rapidly processing multiple substrates at a time in a reproducible manner.

DETAILED DESCRIPTION OF THE DRAWINGS

Figure 1:
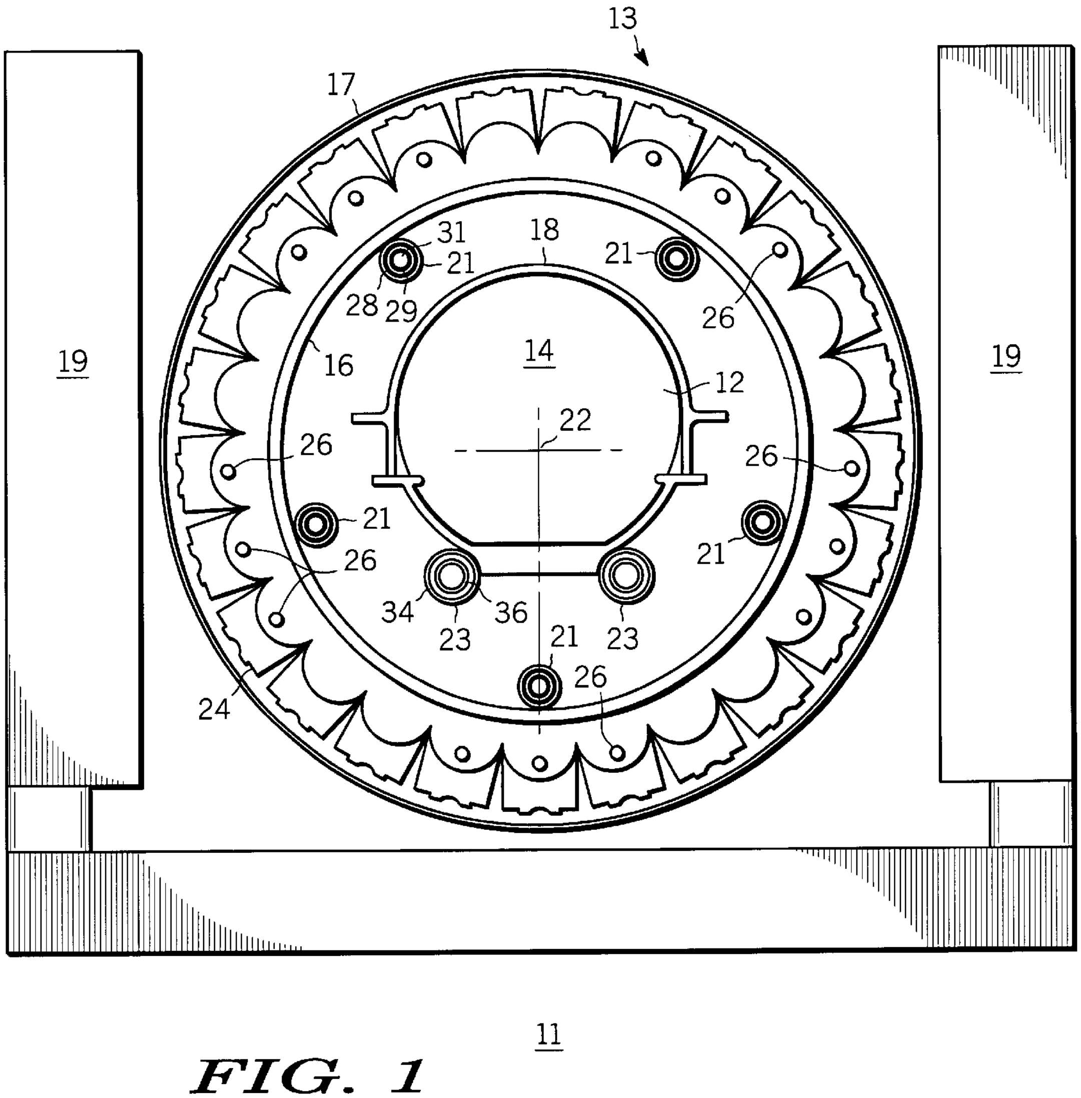
FIG. 1 illustrates an end view of a portion of an annealing apparatus according to the present invention.

In general, the present invention relates to structures and methods for thermally heating electronic devices or semiconductor substrates in a batch form. More particularly, the present invention includes a cylindrically shaped process chamber having a pair of opposing ends. When substrates to be processed are placed within the process chamber, the major surfaces of the substrates are substantially parallel to the opposing ends. A cylindrically shaped lamp array is placed around the process chamber to provide a heat source for the substrates.

In one embodiment, a magnet is placed around the process chamber and lamp array to provide a magnetic field of desired strength within the process chamber. In a preferred embodiment, an IR absorbing structure substantially surrounds the substrates to provide enhanced heating uniformity. In a further embodiment, lamps within the lamp array are provided in a multiple zone configuration, with each zone having independent temperature monitoring and power control.

One emerging area of NVM technology utilizes magnetoresistive or giant magnetoresistive materials. In magnetoresistive RAM (MRAM or GMRAM) technology, devices are built from alternating ultra-thin layers of magnetic and non-magnetic materials. In a typical MRAM device, a conductive non-magnetic interlayer separates or is sandwiched between two magnetic layers. The resistance of the conductive non-magnetic interlayer is a function of conduction electron spin-dependent scattering at the boundaries between the non-magnetic conducting layer and the magnetic layers.

Spin-dependent scattering is a quantum mechanical effect where the relative orientation of the conduction electron spins and the magnetic moment of the magnetic material affect the mean free path of electrons in magnetic conductors, and in turn their resistivity. The resistivity of metals is dependent upon the mean free path of the conduction electrons. The shorter the mean free path, the higher the resistance of the metal.

Absent an external magnetic field, the magnetic layers are antiferromagnetically coupled. That is, the magnetic moments of the magnetic layers are parallel to each other, but in opposite directions. This is commonly referred to as "anti-parallel." When the magnetic layers are anti-parallel, electron scattering is at a maximum, and thus, the resistance of the conductive layer is maximized.

Under an external magnetic field, the bottom magnetic layer becomes parallel with the top magnetic layer. When the magnetic layers are parallel, electron scattering is at a minimum, and thus the resistance of the conductive layer is minimized. Examples of materials used in MRAM technology for the magnetic layers include alloys of iron (Fe), cobalt (Co), or nickel (Ni). Examples of materials used for the inner conductive layer include copper (Cu) or platinum (Pt).

One critical processing step used in MRAM manufacturing is the application of an appropriate magnetic field and thermal conditions to magnetize the top and bottom layers, to align the magnetic moments of the top and bottom magnetic layers, and to alloy the materials thereby lowering total electrical resistance.

One prior art apparatus used to provide this function involves a single wafer chamber placed in proximity to a permanent magnet. During the process, a single wafer is heated using a heated gas while exposed to the magnetic field. This approach has several disadvantages including poor temperature control (e.g., slow ramp rates) and single wafer processing. Both of these factors affect manufacturing throughput and cost of ownership.

FIG. 1 illustrates an end-view of an apparatus, process structure, or batch anneal device 11 for processing substrate or substrates 12. Apparatus 11 includes a cylindrical lamp array 13, a cylindrical process tube, chamber, vessel, or round process tube 16, and substrate enclosure structure or substrate support device 18. Cylindrical process chamber 16 has a lengthwise central axis 22, which is normal to the page in FIG. 1. An outer shell or skin 17 encloses cylindrical lamp array 13. Apparatus 11 further includes temperature control structures or control devices 21, which are attached or coupled to chamber 16 in proximity to lamps 26. Supports or rails 23 support substrate enclosure 18 and substrates 12 while within chamber 16, and further provide support while enclosure 18 and substrates 12 are moved in and out of chamber 16.

Substrates 12 comprise, for example, a semiconductor material such silicon, GaAs, silicon-germanium, or other III–V or IV—IV materials. Alternatively, substrates 12 comprise a metal, an insulator or combinations thereof. Substrates 12 either are blank or contain, for example, individual devices such as integrated circuit devices or discrete devices.

In an embodiment suitable for processing MRAM memory devices, apparatus 11 includes a device for providing a magnetic field or magnet 19, which partially surrounds or surrounds a portion of cylindrical lamp array 13 and chamber 16 in a "U" like configuration. For MRAM processing, a 100–2000 Gauss (or greater) fixed position dipole permanent magnet is suitable for providing an appropriate magnetic field within chamber 16 to magnetize the magnetic layers of an MRAM device. Such magnets are available from Dexter Magnetic Technologies of Fremont Calif. Alternatively, magnet 19 comprises an electromagnetic, a superconductive magnet, or the like. For 100, 125, 150 or 200 millimeter (mm) substrate processing, the inside distance between the sides of magnet 19 is about 414 mm (about 16 inches), with a diameter for outer shell 17 of 389 mm (about 15 inches) being appropriate. Additionally, these dimensions are scalable for 300 or 400 mm substrates.

According to the present invention, cylindrical lamp array 13 includes a plurality of lamp holders or lamp carriers 24 and a plurality of lamps or thermal energy sources 26. Preferably, lamp carriers 24 have a curved or parabolic shape, are liquid cooled and are comprised of aluminum. The parabolic or curved shape of lamp carriers 24 is preferred in order to focus light energy from lamps 26 in a distinct path towards chamber 16. Lamp carriers 24 preferably are placed close together to minimize light leakage between carriers. Alternatively, lamp carriers 24 have a flat or circular shaped reflective surface.

To provide reflectance and a desired spectral response, the reflective surface of each of lamp carriers 24 preferably is polished to provide a mirror finish. Lamp carriers 24 typically have a length on the order of about 0.965 meters (about 38 inches), but can be longer or shorter. Liquid cooled lamp holders suitable for lamp holders 24 are available from Research Incorporated of Eden Prairie, Minn. Alternatively, the reflective surface of lamp carriers 24 is coated with gold, aluminum, chrome, platinum, silver, silicon nitride, tantalum carbide, titanium nitride, combinations thereof, or the like to provide a desired spectral response.

Lamps 26 are placed within a portion of, or all of lamp carriers 24, with the sides of lamps 26 running the length of chamber 16. In this configuration, major surfaces 14 of substrates 12 are substantially perpendicular to lamps 26. That is, cylindrical lamp array 13 surrounds cylindrical process vessel 16, and lamps 26 are positioned so that the sides of lamps 26 substantially focus light energy towards or in the direction of lengthwise central axis 22 of cylindrical process vessel 16. Substrates 12 are placed within cylindrical process vessel 16 with major surfaces 14 substantially normal to lengthwise central axis 22. This orientation provides rapid heating and cooling capability for processing large batches of substrates 12.

In the embodiment of FIG. 1, the ends of lamps 26 are shown, with the cylindrical sides of lamps 26 running into the page. This is more readily apparent in FIG. 3. In an alternate embodiment, lamp array 13 comprises a plurality or stack of circular or "donut-shaped" lamps stacked to form a cylinder like shape, which surrounds cylindrical process tube 16.

In a configuration suitable for rapidly heating substrates 12 comprising MRAM or GMRAM memory devices, lamps 26 preferably comprise a heat source that does not significantly interfere with the magnetic field generated by magnet 19. Preferably, lamps 26 comprise quartz halogen lamps (2,000 to 20,000 Watts, with 3,800 Watts being convenient). Such lamps are further preferred because they respond quickly to external control inputs compared to metal winding heating elements used in conventional batch furnaces.

To keep lamps 26 cool and to prevent excessive heat from reaching magnet 19, lamp carriers 24 are preferably liquid cooled (e.g., water cooled). A flow rate of approximately 0.02 liters per second of 70° C. water through each of lamp carriers 24 is suitable for cooling 3,800 Watt quartz halogen lamps. Additionally, it is preferred that magnet 19 not be exposed to temperatures greater than about 100° C. In a further embodiment, cooling fans or the like are added to apparatus 11 to further assist in cooling magnet 19.

Figure 2:
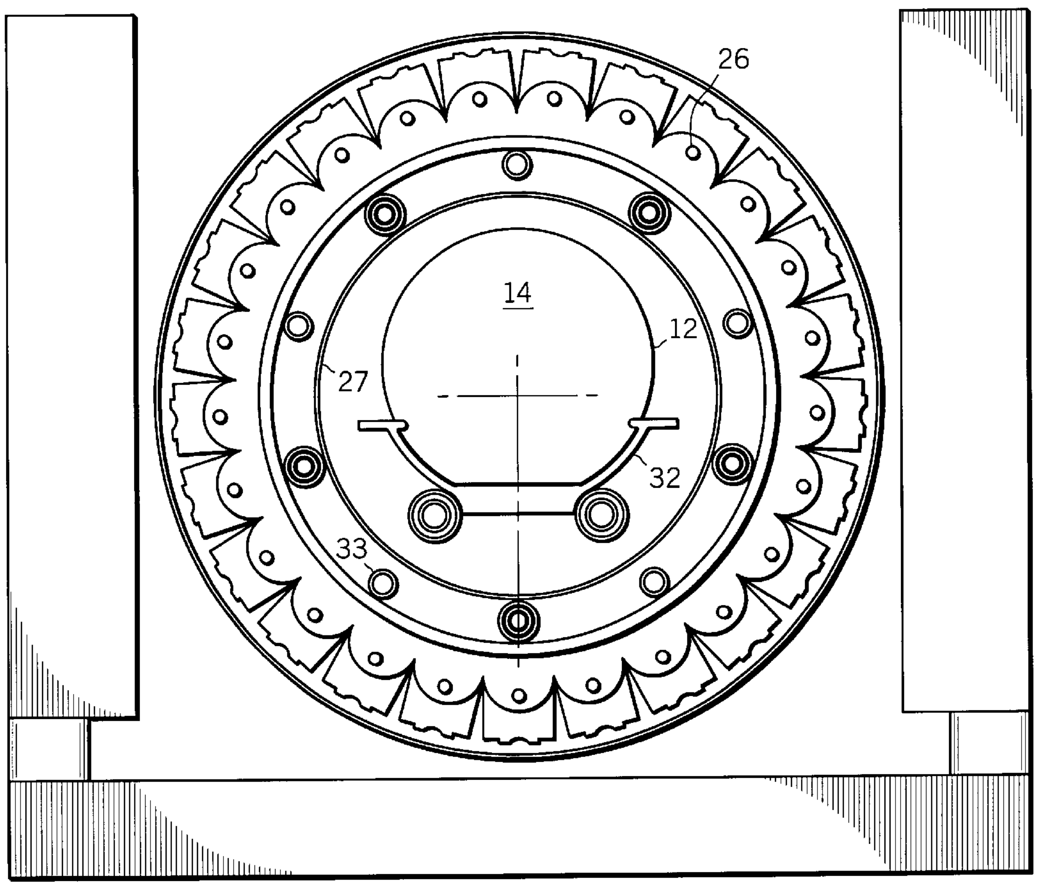
FIG. 2 illustrates an alternative embodiment of an annealing apparatus according to the present invention.

In the configuration suitable for MRAM processing where the magnetic layers are annealed and magnetized, lamps 26 preferably are placed in a star-like pattern around chamber 16 in groups of three lamps to provide five heating zones. However, depending on the desired application, more or less lamps 26 are used to provide more or less heating zones (e.g., FIG. 2 shows lamps 26 in all positions).

Preferably, each of the five zones is individually powered and controlled to provide multiple zone temperature control during processing. This provides flexible, simplified, and repeatable process control. In FIG. 1, lamps 26 are shown in the star-like pattern with three groups of lamps around the bottom half and two groups of lamps around the top half of chamber 16. Alternatively, three groups of lamps are placed around the top half and two groups of lamps are placed around the bottom half of chamber 16.

Chamber 16 preferably comprises a material that is substantially transparent or that absorbs minimal IR energy from lamps 26. Clear fused or sand quartz are suitable. Alternatively, chamber 16 comprises silicon carbide, alumina or a refractory metal such as titanium, tantalum, or the like. Rails 23 each preferably comprise an outer sheath 34 and an inner sheath 36. Outer sheath 34 comprises, for example, quartz and inner sheath 36 comprises alumina-silica or silicon carbide.

Control devices 21 each preferably comprise an outer sheath 28, an inner sheath 29, and a temperature transducer 31. In a preferred embodiment for use with quartz halogen lamps, outer sheath 29 comprises quartz, inner sheath 29 comprises silicon carbide, and temperature transducer 31 comprises a two junction profile/spike configuration thermocouple. It was found that a silicon carbide inner sheath provides a more accurate temperature reading during processing compared to a design consisting of an outer quartz sheath only. This provides better process control and leads to longer lamp life. Quartz and silicon carbide sheaths are available from Norton Electronics of Pittsburgh, Pa.

Control devices 21 are coupled to a temperature control system (not shown) that analyzes temperature data and controls power adjustments to maintain the desired temperature profile within chamber 16. It is important for the temperature control system to quickly respond to temperature changes caused by system variables. A model based controller is preferred over a conventional proportional integral derivative (PID) controller. Model based controllers are available from companies such as SEMY Engineering of Phoenix, Ariz. Using a model based controller, apparatus 11 provides a steady state temperature capability of less than ±0.5° C. across five zones.

Outer shell 17 surrounds and encloses cylindrical lamp array 13. Preferably, outer shell 17 comprises stainless steel with the inner surface polished to provide a mirror finish. The mirror finish serves to reflect any stray light from lamps 26 during processing.

Substrate enclosure 18 preferably comprises a material having a very low emissivity. For example, substrate enclosure 18 comprises silicon carbide or the like. During processing, substrate enclosure 18 absorbs IR energy from lamps 26 to provide a radiant heat source for substrates 12. This allows substrates 12 to heat more uniformly.

In an alternative embodiment, and as shown in FIG. 2, an insert or liner 27 is placed within chamber 16 between control devices 21 and substrates 12. Insert 27 can run the length of chamber 16 or only occupy a portion of chamber 16. Insert 27 preferably comprises a material having a low emissivity (e.g., silicon carbide or the like), and is used instead of enclosure 18 to provide a radiant heat source. A boat 32 provides support for substrates 12, and preferably comprises quartz.

In an embodiment where liner 27 occupies a portion of chamber 16 only, substrates 12 are placed within liner 27 for the heating cycle. During the cooling cycle, substrates 12 are moved outside of liner 27 to another portion of chamber 16 or out of chamber 16 to allow for a faster cooling rate. Optionally, injectors 33 are used to inject a gas (e.g., nitrogen) through openings in injectors 33 to provide enhanced heat removal during the cooling cycle.

In a further embodiment, apparatus 11 is provided absent magnet 19. In this further embodiment, apparatus 11 is suitable for rapid batch thermal processing of substrates 12. For example apparatus 11 is suitable for implant anneals, dopant diffusion, gate dielectric formation (e.g., oxides, oxy-nitrides, high K dielectrics, and the like), silicide formation, borophosphosilicate glass (BPSG) reflow, polysilicon activation, refractive metal nitride diffusion barriers, polycide formation, oxide densification, sintering, alloying, or the like. Additionally, apparatus 11 is suitable for use as a horizontal system, a vertical system, or an orientation in-between.

As described herein, apparatus 11 provides temperature ramp-up rates of about 150° C./minute and ramp down rates of about 50° C./minute with a preferred upper temperature limit on the order of 1300° C. Various ambients (i.e., inert and/or reactive) are used depending on the process application. For processing MRAM/GMRAM devices as will be described in more detail below, a low $O_2$ environment is preferred.

Figure 3:
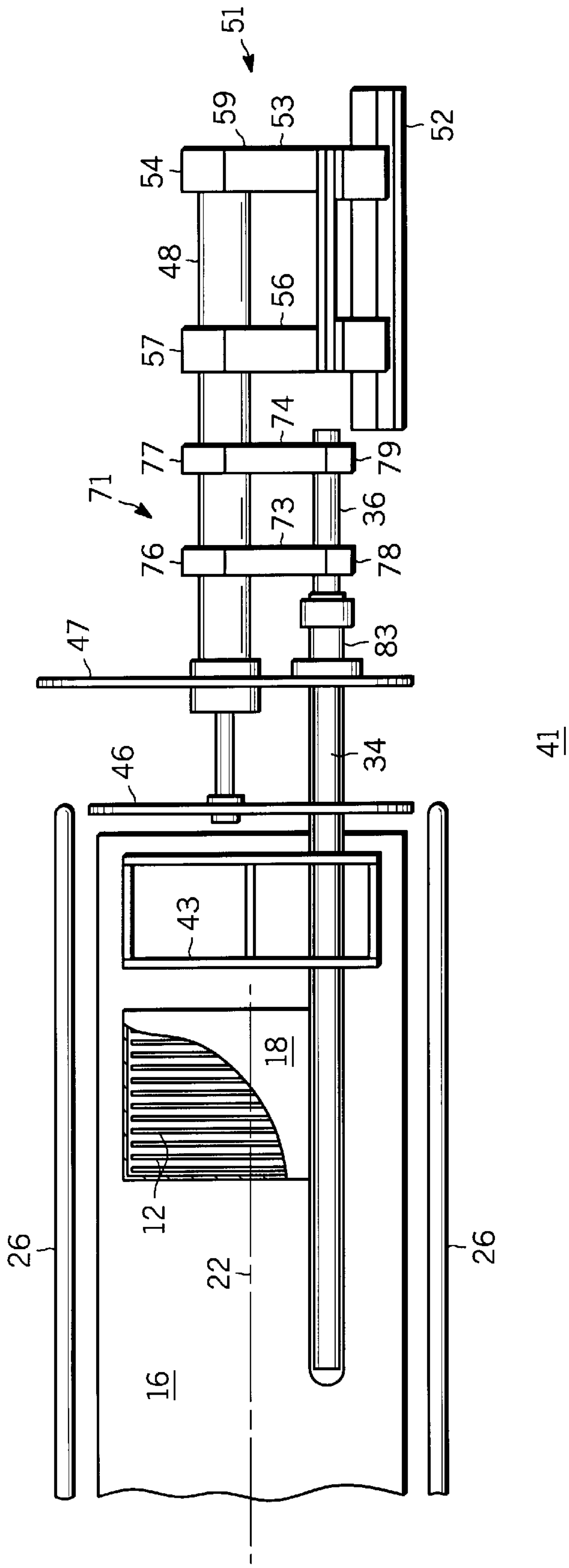
FIG. 3 illustrates a side view of a substrate loading device according to the present invention.

FIG. 3 illustrates a side view of an adjustable substrate loading apparatus 41 according to present invention. Apparatus 41 is pertinent to apparatus 11 when used with magnet 19 in the processing of storage devices to provide a means for skew adjust. That is, apparatus 41 is used to both load substrates 12 into chamber 16 and to provide a means for accurately aligning substrates 12 to a desired orientation within the magnetic field provided by magnet 19. A simplified view of lamps 26 is provided to further show the orientation of substrates 12 with respect to lamps 26.

Apparatus 41 is shown with enclosure 18 in a partial cut-away view to show substrates 12 contained inside. Rails 23 support enclosure 18, a baffle 43, a first door 46, and a second door 47. In a preferred embodiment, baffle 43 and first door 46 comprise quartz, and second door 47 comprises a metal such stainless steel. Baffle 43 provides for a more stable temperature profile during processing, increases gas velocity during processing, and minimizes the opening of chamber 16 to reduce the exposure to room ambient, which can be detrimental to device performance.

Apparatus 41 further includes a support bar 48 mounted to a support structure or loader head assembly 51. A drive motor (not shown) moves support structure 51 along track 52 to move enclosure 18 and baffle 43 into chamber 16. Pedestals 53 and 56 provide support for support bar 48. Top members or clamps 54 and 57 are coupled to pedestals 53 and 56 respectively using, for example, mounting bolts (not shown).

Cantilever clamping assembly 71 is attached to a portion of support bar 48. Cantilever clamping assembly 71 includes support pedestals 73 and 74 and clamping portions 76 and 77, which are attached using, for example, bolts, fasteners, or the like. Clamping portions 78 and 79 hold inner sheath 36 to pedestals 73 and 74, and are attached using, for example, bolts, fasteners, or the like. A sheath seal assembly 83 couples inner sheath 36 to inner sheath 34. When a multiple rail structure is used, such as that shown in FIG. 1, one support bar/sheath seal assembly is used for each rail.

Figure 4:
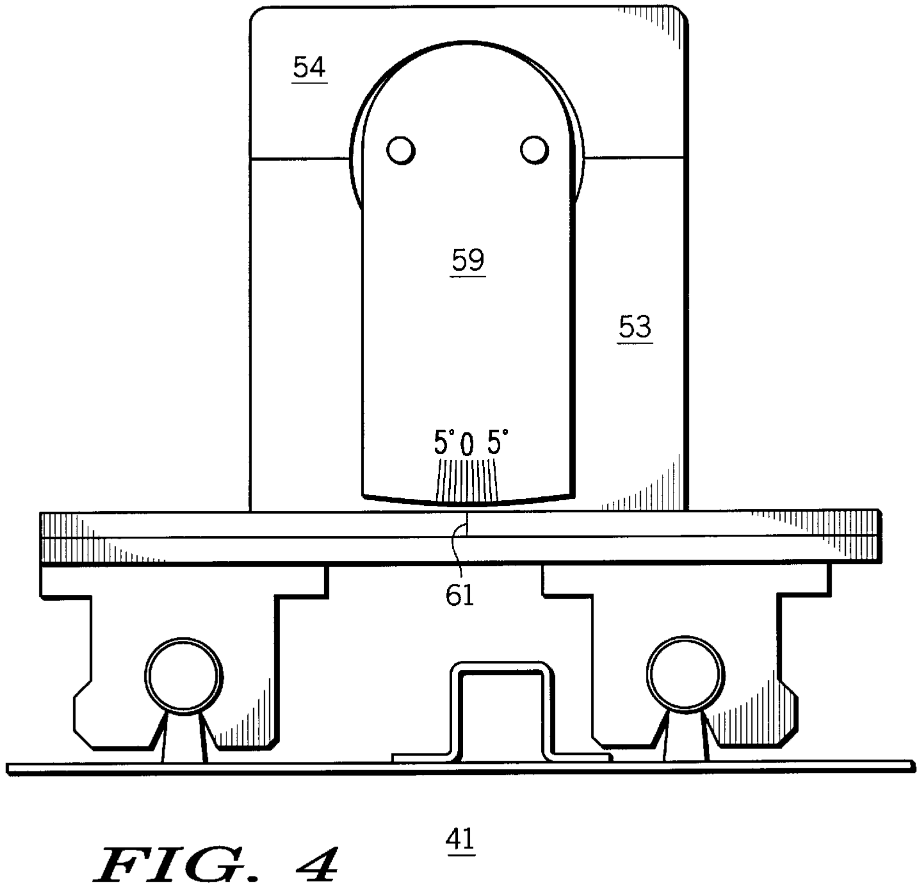
FIG. 4 illustrates an end view of the substrate loading device of FIG. 3.

As indicated above, in the processing of MRAM and GMRAM devices, it is necessary to align the magnetic moments of the top and bottom magnetic layers of the devices. In order to provide proper alignment of the magnetic moments, it is necessary to provide a means for accurately aligning substrates 12 to the magnetic field. To do this, an alignment gauge 59 is attached to one end of support 48. FIG. 4 illustrates an end view of apparatus 41, and better shows a preferred alignment device 59.

To provide the desired alignment of substrates 12, the mounting bolts holding top members 54 and 57 to pedestals 53 and 56 are loosened. Support bar 48 is then rotated to a desired positioned with respect to reference point 61. The desired position is typically established using test wafer measurements or the like. Once the desired position is obtained, the mounting bolts are again tightened. After system alignment, the major flats of substrates 12 preferably are aligned in a down position in enclosure 18. Alternatively, the desired position of substrates 12 with respect to the magnetic field is done using automated alignment.

In a method for processing substrates 12 when substrates 12 comprise MRAM or GMRAM devices, apparatus 41 is adjusted as described above so that substrates 12 are appropriately aligned to the magnetic field provided by magnet 19. Substrates 12 are then loaded in enclosure 18 in a major flat down orientation.

The materials used in manufacturing MRAM/GMRAM devices are susceptible to oxidation, and as a result, oxygen within chamber 16 must be purged to avoid impaired device performance. An oxygen concentration of less than about 20 parts per million (ppm) within chamber 16 is preferred when processing MRAM or GMRAM devices.

Before substrates 12 are loaded into chamber 16, chamber 16 is purged using, for example, nitrogen. Preferably, chamber 16 is purged for approximately 10 minutes using a flow rate of about 50 standard liters per minute (SLPM), while chamber 16 is maintained at a temperature of approximately 100 to 300° C. After chamber 16 is pre-purged, substrates 12 are inserted into chamber 16 so that substrates 12 are within the magnetic field provided by magnet 19, and stabilized for about 2 to 5 minutes. Alternatively, a vacuum pump or the like is used to evacuate or purge chamber 16 after substrates 12 are inserted.

After stabilization, a process gas such as nitrogen, forming gas, argon, or the like is introduced into chamber 16 at flow rate of approximately 35 SLPM. The temperature within the chamber is ramped to the desired process temperature preferably at about 15 to about 30° C./min. For example; substrates 12 are processed for approximately 45 to 90 minutes at 400° C. Control devices 21 provide accurate feedback for temperature control during processing. Once substrates 12 are processed, chamber 16 is cooled at rate of about 3 to about 10° C./min, and substrates 12 are removed from chamber 16. Substrates 12 are then ready for the next level of processing.

Figure 5:
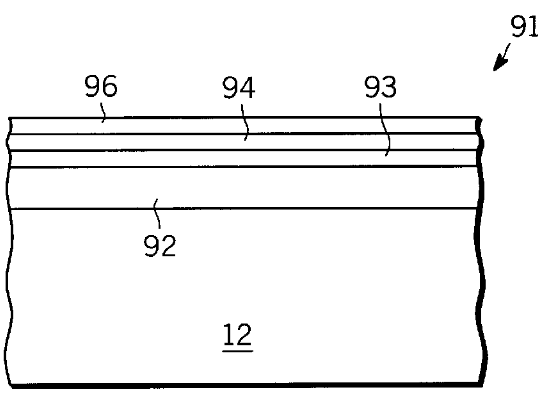
FIG. 5 illustrates a cross-section view of a portion of a non-volatile memory device processed according to the present invention.

FIG. 5 illustrates a partial cross-section view of an MRAM/GMRAM device 91 processed as described above. Device 91 includes an insulating layer 92 formed over substrate 12. A first magnetic layer 93 is formed over insulating layer 92, a conductive non-magnetic layer 94 is formed over first magnetic layer 92, and a second magnetic layer 96 is formed over conductive non-magnetic layer 94. After processing according the present invention, first and second magnetic layers 93 and 96 are magnetized and their magnetic moments aligned. In addition, the materials are alloyed to further lower total electrical resistance.

For processing substrates 12 absent exposure to magnet 19, substrates 12 are placed in enclosure 18, chamber 16 is pre-purged as required, substrates 12 are then placed in chamber 16 with an appropriate process gas or gases. Substrates 12 are then heated to the desired temperature for an appropriate time. Next substrates 12 are cooled and removed from chamber 16.

Alternatively, substrates 12 are placed in boat 32 (as shown in FIG. 2) instead of enclosure 18. After pre-purge, substrates 12 are placed within liner 27 in chamber 16 with an appropriate process gas or gases. Substrates 12 are then heated to a desired temperature for an appropriate time. Next substrates 12 are either cooled while still within liner 27, or substrates 12 are removed from liner 27 for faster cooling. Alternatively, substrates 12 are further cooled using injectors 33 or the like.

Figure 6:
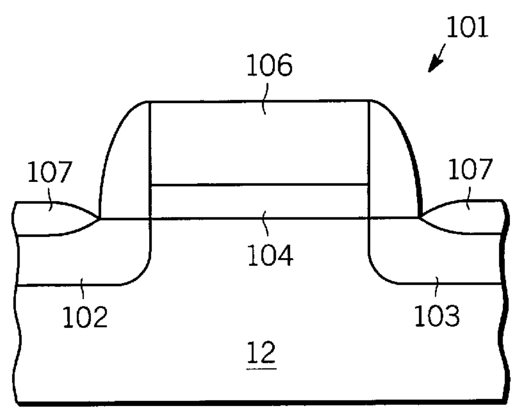
FIG. 6 illustrates a cross-sectional view of a portion of semiconductor device processed according to the present invention.

FIG. 6 illustrates a cross-sectional view of a portion of a semiconductor device 101 processed using the apparatus of the present invention. For example, apparatus 11 is used to anneal source and drain regions 102 and 103 (e.g., source and drain regions are annealed at about 800° C. to about 1200° C. in an inert ambient). Also, apparatus 11 is used to form gate dielectric structure 104. For example, gate dielectric structure is grown using a dry $O_2$ source at a temperature in a range from about 750° C. to about 1000° C. Optionally, thermal nitridation using an $NH_3$ source is used in combination with the gate oxide to form oxynitride structures. In addition, apparatus 11 is used to dope gate conductive layer 106 (similar to the process used to form source and drain regions 102 and 103) and silicide regions 107. For example, silicide regions 107 are formed at about 600° C. to about 800° C. in an inert ambient such as argon.

By now it should be apparent that structures and methods have been provided for improved rapid thermal processing of substrates. In particular, by providing a cylindrical lamp array structure, batch processing of substrates is achieved by placing the major surfaces of the substrates substantially perpendicular or normal to the cylindrical lamp array structure. This greatly improves throughput and cost of ownership compared to prior art RTP systems. Additionally, by adding an optional magnetic field source surrounding at least portion of the lamp structure, storage devices such as NVM devices are processed in a reliable and reproducible manner compared to prior art systems.

What is claimed is:

1. An apparatus comprising:

a cylindrical process vessel having a lengthwise central axis;

a cylindrical lamp array surrounding said process vessel, wherein said cylindrical lamp array includes a plurality of lamps for heating a plurality of substrates, each having a major surface, and wherein said plurality of lamps are positioned to substantially focus light energy towards said lengthwise central axis and wherein power provided to said plurality of lamps is controlled to provide a plurality of heating zones;

a temperature control device comprising a temperature transducer within an inner sheath, wherein said inner sheath is within an outer sheath, and wherein said temperature control device is placed within said cylindrical process chamber; and a support structure for supporting said plurality of substrates in said cylindrical process vessel, wherein said support structure orients said major surfaces of said plurality of substrates substantially normal to said lengthwise central axis and spaced apart from each other along said lengthwise central axis when said plurality of substrates is placed within said cylindrical process vessel.

2. The apparatus of claim 1 further comprising a magnetic field source surrounding at least a portion of said cylindrical lamp array and at least a portion of the support structure to provide a magnetic field within said cylindrical process vessel.

3. The apparatus of claim 1 wherein said cylindrical lamp array includes a plurality of parabolic reflectors for holding said plurality of lamps, and wherein a reflective surface of said parabolic reflectors is coated with a material selected from a group consisting of gold, aluminum, chrome, platinum, silver, silicon nitride, tantalum carbide, titanium nitride or combinations thereof.

4. The apparatus of claim 1 wherein said support structure comprises an enclosure that holds a plurality of substrates, and wherein said enclosure comprises a high emissivity material.

5. The apparatus of claim 1 wherein said plurality of lamps have a length running substantially parallel to said lengthwise central axis.

6. The apparatus of claim 1 wherein said plurality of lamps each have a length running along a length of said cylindrical process vessel adjacent at least said plurality of substrates.

7. The apparatus of claim 1 wherein said plurality of heating zones each comprise a portion of the cylindrical process vessel substantially parallel to said lengthwise central axis adjacent at least said plurality of substrates.

8. The apparatus of claim 1 wherein said inner sheath comprises silicon carbide, and wherein said outer sheath comprises quartz.

9. The apparatus of claim 1 further comprising a model based controller coupled to said temperature control device.

10. The apparatus of claim 1 further comprising a liner placed within at least a portion of cylindrical process vessel, wherein said liner comprises a high emissivity material.

11. The apparatus of claim 1 wherein said plurality of substrates includes a plurality of peripheral edges, and wherein said support structure comprises a quartz boat that supports said plurality of substrates plurality of substrates by the plurality of peripheral edges.

12. An apparatus comprising:

a cylindrical process vessel having a lengthwise central axis;

a plurality of lamps for heating a substrate having a major surface, and wherein said plurality of lamps have a length running along a length of said cylindrical process vessel adjacent at least said substrate and wherein power provided to said plurality of lamps is controlled to provide a plurality of heating zones;

a control device within said cylindrical process chamber including an outer sheath, an inner sheath within said outer sheath, and a temperature transducer within said inner sheath; and a support structure for supporting said substrate in said cylindrical process vessel, wherein said support structure orients said major surface substantially perpendicular to said lengthwise central axis when said substrate is placed within said cylindrical process vessel.

13. The apparatus of claim 12 further comprising a magnet surrounding at least a portion of said cylindrical process vessel and a portion of said support structure.

14. The apparatus of claim 13 wherein said magnet comprises one of a fixed position dipole permanent magnet, an electromagnet, or a superconductive magnet.

15. The apparatus of claim 12, wherein said control device includes an outer quartz sheath and an inner silicon carbide sheath.

16. The apparatus of claim 12 wherein said substrate peripheral edge, and wherein said support structure comprises a quartz boat that supports said substrate by the of peripheral edge.

17. An apparatus for rapid thermal processing a plurality of substrates comprising:

a cylindrical process chamber having a lengthwise central axis;

a plurality of lamps for heating the plurality of substrates, each having a major surface and a peripheral edge, and wherein said plurality of lamps have a length running along a length of said cylindrical process vessel adjacent said plurality of substrates;

a control device including an outer sheath, an inner sheath within said outer sheath, and a temperature transducer within said inner sheath, wherein said temperature control device is placed within said cylindrical process chamber; and a support structure for supporting said peripheral edges of said plurality of substrates in said cylindrical process vessel, wherein said support structure orients said major surfaces of said plurality of substrates substantially perpendicular to said lengthwise central axis and spaced apart from each other along said lengthwise central axis when said plurality of substrates is placed within said cylindrical process vessel.

18. The apparatus of claim 17 further comprising a magnet adjacent at least a portion of said cylindrical process chamber and a portion of said support structure.

19. The apparatus of claim 17 wherein said inner sheath and said outer sheath comprise different materials.

* * * * *